US009917553B2

(12) United States Patent
Alenin et al.

(10) Patent No.: US 9,917,553 B2
(45) Date of Patent: Mar. 13, 2018

(54) LOW DISTORTION OUTPUT STAGE FOR AUDIO AMPLIFIERS

(71) Applicant: Texas Instruments Incorporated, Dallas, TX (US)

(72) Inventors: Sergey V. Alenin, Tucson, AZ (US); Steven G. Brantley, Satellite Beach, FL (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/187,071

(22) Filed: Jun. 20, 2016

(65) Prior Publication Data

US 2017/0366142 A1 Dec. 21, 2017

(51) Int. Cl.
*H04R 3/04* (2006.01)
*H03F 1/32* (2006.01)
*H03F 1/34* (2006.01)
*H03F 3/26* (2006.01)
*H03F 3/45* (2006.01)
*H03F 3/187* (2006.01)

(52) U.S. Cl.
CPC .............. *H03F 1/3211* (2013.01); *H03F 1/34* (2013.01); *H03F 3/187* (2013.01); *H03F 3/26* (2013.01); *H03F 3/45085* (2013.01); *H04R 3/04* (2013.01); *H03F 2203/45112* (2013.01); *H04R 2201/028* (2013.01)

(58) Field of Classification Search
CPC .......... H03F 1/3211; H03F 1/34; H03F 3/187; H03F 3/26; H03F 3/45085; H03F 2203/45112; H04R 3/04; H04R 2201/028
See application file for complete search history.

(56) References Cited

U.S. PATENT DOCUMENTS

| 5,086,474 A | * | 2/1992 | Rumreich | ............... H03F 3/187 330/151 |
| 5,627,495 A | * | 5/1997 | Halbert | ................. H03F 3/3076 330/256 |

* cited by examiner

*Primary Examiner* — Mark Fischer
(74) *Attorney, Agent, or Firm* — Gregory J. Albin; Charles A. Brill; Frank D. Cimino

(57) ABSTRACT

A circuit and method for an audio op-amp that is configured to minimize crossover distortion between push and pull components of the audio op-amp. The audio op-amp includes an input stage that receives differential input signals and generates an output that amplifies the difference between the input signals. The audio op-amp further includes an output stage that receive the amplified signal and generate an audio output signal for playback by a speaker system. The output stage includes a diamond driver circuit that buffers the input stage from the speaker system, a boost circuit that includes a pair of boosting transistors that amplify the current of the amplified signal, and a biasing circuit that provides bias currents to the transistors of the boost circuit in a manner that minimizes crossover distortion between the boosting transistors.

18 Claims, 2 Drawing Sheets

LOW DISTORTION OUTPUT STAGE FOR AUDIO AMPLIFIERS

TECHNICAL FIELD

The recited claims are directed, in general, to audio operational amplifiers and, more specifically, to the output stage of audio operational amplifiers.

BACKGROUND

Amplifiers are used to increase the power of an electrical signal. One common type of amplifier is an operational-amplifier (op-amp), a high-gain voltage amplifier having a pair of differential inputs and an output. The op-amp amplifies the difference between the voltages at the inputs, typically by a factor of hundreds or thousands, and presents the amplified difference at the output. Op-amps may be constructed using a number of circuit configurations in order to configure the op-amp for use in performing various functions. For instance, audio devices commonly utilize audio op-amps that are configured particularly for the amplification of audio signals within the range of human hearing.

A single op-amp is frequently unable to provide the full amount of amplification that is required by the system utilizing the output of the op-amp. Even if a single op-amp is able to provide the required amplification, the op-amp may be unable to do so within the operational parameters required by the host system. Consequently, op-amps commonly utilize multiple, cascaded stages of amplification, with each stage comprising of one or more amplification circuits. The output of each stage is coupled in some way to the input of the next stage. Certain features of the amplifier may be implemented as additional, non-amplifying stages. An op-amp typically consists of at least two stages: an input stage and an output stage. In a differential amplifier, the input stage has the task of deriving the difference between the two inputs. The input stage or other intervening stages provide the gain used to amplify the difference between the two input signals. The output stage modifies the amplified signal such that the output satisfies the requirements set forth by the host system.

Audio op-amps are used in a wide variety of audio devices. The fidelity and other output characteristics that are required in the output signal generated by an audio op-amp vary significantly based on the audio device application. For instance, audio op-amps used in home theater equipment will have different current, voltage and impedance requirements than an audio op-amp used to provide audio for a set of headphones. In all applications, audio op-amps seek to provide an output signal that replicates the input signal with as little distortion as possible. A common measure of the output fidelity of an audio op-amp is the total harmonic distortion (THD) in the output. The lower the THD the more accurately the output of the op-amp replicates the input to the audio op-amp.

The output stage of an op-amp may utilize a "push-pull" arrangement of transistors or other switching elements to provide current to components of the output stage. In some push-pull configurations, pairs of complementary transistors alternatively source or sink the current of the audio signal. In other push-pull configurations, the pairs of transistors alternate between high and low voltages for powering the components of the op-amp. The use of push-pull arrangements allows for efficient use of power and promotes cancelling of noise and non-linear distortions.

Crossover distortion is a particular variant of THD that can result from the use of push-pull configurations of switching elements in an amplifier. In a push-pull arrangement, the switching elements are used in pairs, with the switching elements that comprise a pair each providing amplification for only a half-cycle of the input signal. Crossover distortions arise in the output of a push-pull circuit due to non-synchronized transitions from one switching element to another at each half-cycle boundary. For instance, lack of synchronization during these transitions may result in intervals where both switching elements of a pair are operating simultaneously or intervals where neither switching element in a pair is operating. These non-synchronized transitions between push-pull elements of an amplifier create non-linear regions (i.e., crossover distortions) in the output of the amplifier.

During operation of an op-amp, an output stage consumes current from a power supply. A portion of this current, known as the quiescent current, is used to bias the internal components of the output stage. The quiescent current is the current required to bias all transistors on, while the input is shorted to ground. The quiescent current provides sufficient current for the transistors to maintain the amplifier components in an on state such that they can quickly resume operations. Low quiescent current is desirable because it reduces power consumption when the amplifier is operating at a light load, or with no load.

An audio op-amp output stage is configured to generate an audio signal output that can drive a speaker system of a specified impedance. In light of the low voltage utilized in certain speaker systems, such as headphones, crossover distortion in the audio signal can be particularly problematic. Increasing quiescent current is one way to reduce crossover distortion, but increasing quiescent current may be problematic for battery powered applications. Consequently, there is a need for an audio op-amp that operates using a low quiescent current and is capable of driving low impedance speaker systems while minimizing crossover distortion of the audio signal.

SUMMARY

According to various embodiments, an integrated circuit operational amplifier and associated method are recited comprising: an input stage operable to receive differential input voltage signals and further operable to generate an amplified voltage signal that amplifies the difference between the input voltage signals; and an output stage operable to receive the amplified voltage signal and further operable to generate an audio output signal that modifies the amplified signal for playback by a first speaker system, the output stage comprising: a diamond driver circuit operable to buffer the input stage from the first speaker system; a boost circuit operable to amplify the current of the amplified voltage signal, wherein the boost circuit comprises at least one complementary pair of boosting transistors; and a biasing circuit operable to provide bias currents to the transistors of the boost circuit.

According to various additional embodiments, the at least one pair of boosting transistors are configured to provide push-pull current amplification. According to various additional embodiments, biasing circuit comprises a translinear loop formed by at least one complementary pair of transistors. According to various additional embodiments, the transistors of the translinear loop are biased using two or more pairs of transistors arranged in series. According to various additional embodiments, the bias currents generated by the biasing circuit cause coordinated push-pull crossover transitions between the boosting transistors. According to various additional embodiments, the boosting circuit further comprises a pair of Miller compensation capacitors. According to various additional embodiments, the boosting circuit further comprises a resistor in series with each Miller compensation capacitor. According to various additional embodiments, the integrated circuit operational amplifier further comprises a resistor in series with the audio output signal generated by the output stage. According to various additional embodiments, the series resistor buffers the input stage from the first speaker system. According to various additional embodiments, the diamond driver circuit includes a pair of series current sources that provide a biasing current for use by the biasing circuit.

BRIEF DESCRIPTION OF THE DRAWINGS

Figure 1:
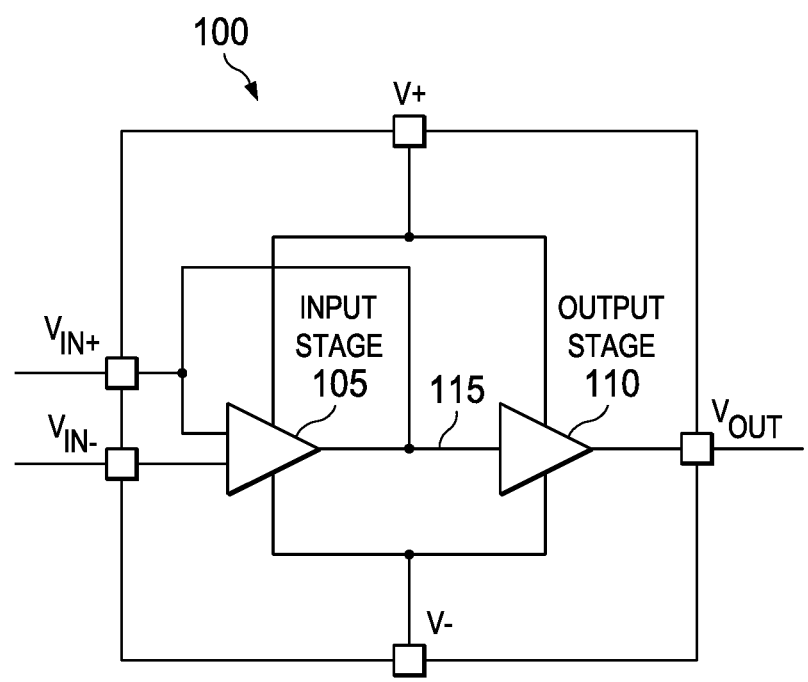

Having thus described the invention in general terms, reference will now be made to the accompanying drawings, wherein:

FIG. 1 is a high-level circuit diagram illustrating certain components of an audio op-amp according to various embodiments.

Figure 2:
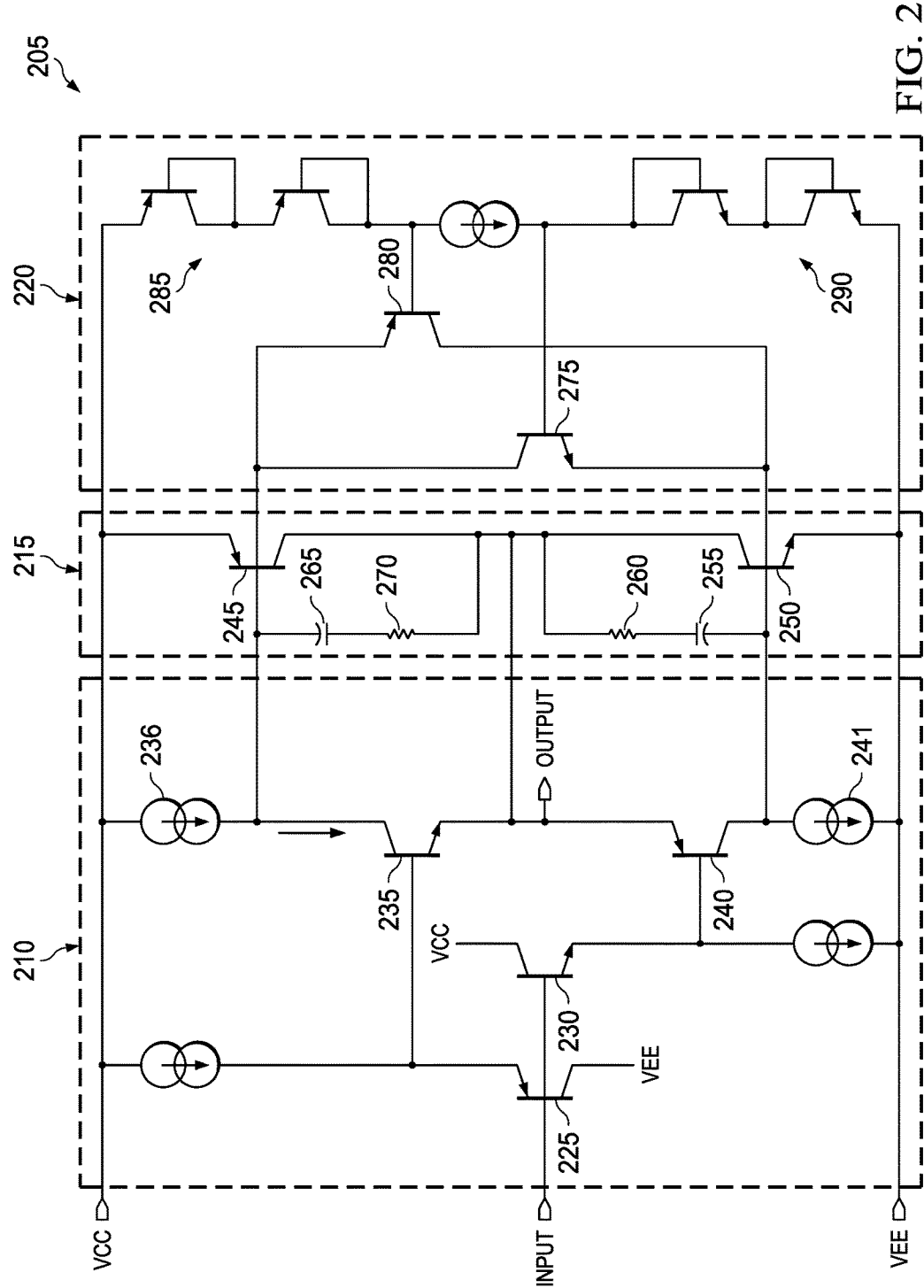

FIG. 2 is a circuit diagram illustrating certain components of an output stage of an audio op-amp according to various embodiments.

DETAILED DESCRIPTION

The invention now will be described more fully hereinafter with reference to the accompanying drawings. This invention may, however, be embodied in many different forms and should not be construed as limited to the embodiments set forth herein. Rather, these embodiments are provided so that this disclosure will be thorough and complete, and will fully convey the scope of the invention to those skilled in the art. One skilled in the art may be able to use the various embodiments of the invention.

FIG. 1 is a high-level circuit diagram illustrating certain components of an audio op-amp 100 according to various embodiments. The audio-op amp 100 is comprised of an input stage 105 amplifier coupled to an output stage 110 amplifier. Other embodiments may utilize various additional stages in addition to an input stage and output stage. For instance, other audio op-amp embodiments may include additional stages for anti-phase-reversal functions and/or biasing functions. Consequently, in other audio op-amp embodiments, the input stage may not be directly coupled to the output stage. In other audio op-amp embodiments, the input stage and/or output stages may be represented as multiple distinct stages rather than as single, monolithic stages.

In audio op-amp 100, the input stage 105 receives a differential input voltage, which is formed by first and second input voltages, $V_{IN+}$ and $V_{IN-}$. The input stage 105 generates a single output 115 that amplifies the differential between the two input voltages, $V_{IN+}$ and $V_{IN-}$. In the embodiment of FIG. 1, the input stage 105 is the only stage that generates a voltage gain in op-amp 100. Consequently, in op-amp 100 there is a unity voltage gain in the output stage 110. In audio op-amp 100, the input stage 105 is comprised of a differential amplifier. The differential amplifier is configured to determine the voltage difference between the input voltages, $V_{IN+}$ and $V_{IN-}$, and to generate on output that amplifies this determined voltage difference. Differential amplifiers are able to reduce and/or eliminate noise that is common to both input voltage signals, $V_{IN+}$ and $V_{IN-}$. Such noise reduction is of particular importance in op-amps used in audio devices.

In the illustrated embodiment, the differential amplifier of input stage 105 is an NPN differential pair differential amplifier. Other audio op-amp embodiments utilizing an NPN differential pair differential amplifier may utilize various additional amplifier components, such as a current mirror, as part of the input stage. Other embodiments may utilize other types of differential amplifiers that provide similar capabilities for the input stage. The particular differential amplifier and the amplifier components that are used in the input stage may be selected based on the ability to generate a significant voltage gain while still providing a linear response, thus improving the ability of the input stage to be the only stage of the audio op-amp that provides a voltage gain.

The output stage 110 of the audio op-amp 100 is used to generate the audio output signal, $V_{OUT}$, that will be played by a speaker system connected to the audio op-amp 100. Based on the output signal 115 provided by the first input stage 105, the output stage 110 transfers the voltage of the output signal to the connected speaker system and generates the current required for playback by the speaker system based on the impedance characteristics of the speaker system. The output stage 110 is configured to generate the output signal, $V_{OUT}$, while introducing minimal distortion of the output signal 115.

The output stage 110 also buffers the input stage 105 from the adverse effects of the speaker and wiring associated with the speaker. For instance, when using a speaker system such as headphones, the speaker wiring includes wires extending from each earpiece speaker to a jack used to connect the headphones to the op-amp host system. The wiring associated with headphone speaker systems is usually highly flexible and is commonly distorted into various positions. For instance, a user may be walking or running while using a headphone speaker system, thus jostling the headphone wiring. In light of the relatively long length of the headphone speaker wires being used in such fashion, components driving audio signals on the speaker wires can be exposed to significant instability in the capacitance and inductance of the speaker wires. Consequently, output stage 110 is configured such that is provides the differential feedback amplifier of input stage 105 a buffer from instability caused by a speaker system such as a headphone and associated headphone wiring.

In certain embodiments, a resistor is included in series with the output signal, $V_{OUT}$ in order to support additional buffering. This series resistor further buffers the op-amp 100, and in particular the input/gain stage 105, from the capacitance of the speaker system. For speaker systems such as headphones, this capacitance can be significant. If the input/gain stage 105 is not sufficiently buffered from this load capacitance, the bandwidth of the stage can be degraded.

FIG. 2 is a circuit diagram illustrated certain components of an output stage 205 of an op-amp that receives an input signal, INPUT, to generate an amplified output signal, OUTPUT, according to various embodiments. Output stage 205 may, in some examples, correspond to output stage 110 shown in FIG. 1. The output stage 205 includes three components, a diamond driver circuit 210, a boosting circuit 215 and a biasing circuit 220. Other embodiments of the output stage may include additional components. The output stage 205 is configured to buffer the input/gain stage 105 described with respect to FIG. 1 from the effects of the speaker and associated wiring and components being used to play the audio output of the op-amp. The components of the output stage 205 are configured to generate an output audio signal that satisfies the current requirements of the speaker system based on the impedance of the speaker system. The output stage 205 is further configured to provide these output capabilities while minimizing the THD of the amplified audio signal and while utilizing quiescent currents that are as low as possible. The output stage 205 is powered by power supply voltages, VCC and VEE, which specify the output voltage range of the amplifier.

The diamond driver circuit 210 is the first component of the output stage 205. In the illustrated embodiment, the diamond driver circuit 210 is comprised of transistors 225, 230, 235 and 240 arranged in a diamond-like topology. The transistors 225, 230, 235 and 240 are arranged as two pairs of complementary transistors that are arranged in crosswise-symmetry, with complementary transistors 225 and 235 forming one pair and complementary transistors 230 and 240 forming the other pair. In each pair of complementary transistors, one is a PNP transistor and the other is an NPN transistor. Other embodiments may utilize different diamond driver transistor topologies known to a person of ordinary skill in the art. As described, the buffering function provided by the diamond driver isolates the op-amp input/gain stage from the effects of the low impedance, high capacitance characteristics of certain speaker systems, such as headphones.

The boosting circuit 215 is coupled to the diamond driver circuit 210. The boosting circuit 215 increases the current of the output audio signal generated by the output stage 205 according to the current requirements of the speaker system to be used for playback. According to various embodiments, the boosting circuit 215 utilizes a pair of complementary transistors. In the embodiment of FIG. 2, the boosting circuit consists of transistors 245 and 250, where one of these transistors is a PNP transistor and the other is an NPN transistor. Also included in the boosting circuit 215 are Miller compensation capacitors 255 and 265 and associated series resistors 260 and 270. Other embodiments may not utilize the Miller compensation capacitors and/or associated series resistors.

The amount of current gain provided by the boosting circuit 215 is determined by the beta of transistors 245 and 250. As illustrated, the output of transistors 245 and 250 of the boosting circuit 215 are included in the primary feedback loop of the output stage 205. Due to the current gain provided by the boosting circuit 215 via the feedback loop, the base drive requirements of the transistors of the diamond driver circuit 210 are reduced, with the amount of the reduction based on the beta of transistors 245 and 250. As a result of the current gain provided by transistors 245 and 250, the boosting circuit 215 also reduces the THD in the output of the diamond driver circuit 210.

As depicted in FIG. 2, a biasing circuit 220 is coupled to the boost circuit 215 of op-amp 205. The biasing circuit 220 is used to bias the boost transistors 245 and 250 of the boost circuit 215. In the illustrated embodiment, the biasing circuit 220 is comprised of a set of six transistors. The transistors of the illustrated biasing circuit 220 include complementary transistors 275 and 280 that provide biasing currents to boost transistors 245 and 250. The biasing circuit 220 is also comprised of two pairs of transistors 285 and 290 that are each comprised of two transistors arranged in series. Each pair of series transistors 285 and 290 alternate in a push-pull fashion in sourcing high and low biasing currents from the power rails and use these biasing currents in biasing the transistors 275 and 280. This form of biasing provided by the biasing circuit 220 may be known as Monticelli biasing. Configured in this manner, the biasing transistors 275 and 280 provide quiescent biasing currents to the boost transistors 245 and 250, such that the distortions resulting from the push-pull transitions between the boost transistors 245 and 250 are minimized.

Other embodiments may utilize biasing circuits with different configurations of components for biasing the boost transistors 245 and 250. In certain embodiments, a translinear loop circuit may be formed using the complementary transistors 275 and 280 that provide biasing currents to boost transistors 245 and 250. For instance, in the illustrated embodiment, two translinear loops are utilized in the biasing of boost transistors 245 and 250. One translinear loop circuit is formed by the loop comprised of boost transistor 245, biasing transistor 280 and the linear pair of transistors 285. Another translinear loop circuit is formed by the loop comprised of boost transistor 250, biasing transistor 275 and the linear pair of transistors 290. Other embodiments that utilize translinear circuits in biasing transistors 275 and 280 may utilize different combinations of components in forming these translinear circuits. For instance, certain embodiments may utilize different or additional components in place of the pairs of series transistors 285 and 290.

As described above, crossover distortion can arise in the output of a push-pull circuits due to non-synchronized transitions between the push and pull components. In the boost circuit 215, crossover distortion may result based on the transitions between boost transistors 245 and 250. The transitions between boost transistors 245 and 250 depends on the properties of the two transistors, most notably the beta and base-emitter voltage, $V_{be}$ of the transistors. These properties are inherently mismatched in a push-pull configuration such as boost circuit 215 that utilize different device types, namely PNP and NPN transistors, on each side of the push-pull configuration. The two transistors may be further mismatched due to manufacturing variances in one or both of the transistors.

Due to the mismatched boost transistors 245 and 250, transitions during crossover between these two push and pull components may not occur smoothly. More specifically, boost transistors 245 and 250 may be both simultaneously on or simultaneously off during a portion of this transition, resulting in crossover distortion. Due to the biasing of the boost transistors 245 and 250 by the components of the biasing circuit 220, crossover distortion between the boost transistors is significantly reduced.

Crossover distortion between the boost transistors 245 and 250 is reduced due to the biasing circuit 220 causing the two boost transistors to transition states in unison during crossover. During the crossover transition between the boost transistors 245 and 250, the boost circuit 215 is balanced. While balanced in the crossover region, the boost transistors 245 and 250 form a unity gain amplifier. Operating as a unity gain amplifier, the boost transistors 245 and 250 operate in unison such that crossover distortion is minimized. In particular, the biasing circuit 220 minimizes the effect of mismatches between the NPN and PNP boost transistor 245, 250 properties, $V_{be}$ and beta, that dictate the crossover distortion in conventional boost circuits. The mismatch between the betas of the boost transistors 245 and 250 may still result in a $2^{nd}$ harmonic due to the differences in gain between the boost transistors, but crossover distortion is minimized. Consequently, crossover transitions between the push-pull components are smoothed.

In the illustrated embodiment, the diamond driver circuit 210 includes current sources 236 and 241 in series with transistors 235 and 240, respectively. These series current sources 236 and 241 serve to provide a biasing current to the biasing circuit 220, which is used to reduce the THD in the output stage 205.

Conventional approaches for reducing crossover distortion in the output stage of an audio op-amp utilize techniques other than the disclosed biasing circuit that smooths the transition between the boost transistors. For instance, the effects of mismatches between the boost transistors can be reduced by re-configuring the two boost resistors as current mirrors. Such conventional techniques may reduce the impact of mismatches, but typically lowers the loop gain of the output stage.

Many modifications and other embodiments of the invention will come to mind to one skilled in the art to which this invention pertains having the benefit of the teachings presented in the foregoing descriptions, and the associated drawings. Therefore, it is to be understood that the invention is not to be limited to the specific embodiments disclosed. Although specific terms are employed herein, they are used in a generic and descriptive sense only and not for purposes of limitation.

What is claimed is:

1. An integrated circuit operational amplifier comprising:
   an input stage operable to receive differential input voltage signals and further operable to generate an amplified voltage signal that amplifies the difference between the input voltage signals; and
   an output stage operable to receive the amplified voltage signal and further operable to generate an audio output signal that modifies the amplified signal for playback by a first speaker system, the output stage comprising:
      a diamond driver circuit operable to buffer the input stage from the first speaker system;
      a boost circuit operable to amplify the current of the amplified voltage signal, wherein the boost circuit comprises at least one complementary pair of boosting transistors, wherein the at least one complementary pair of boosting transistors are configured to provide push-pull current amplification; and
      a biasing circuit operable to provide bias currents to the transistors of the boost circuit.

2. The operational amplifier of claim 1, wherein transistors of the biasing circuit and the boost circuit comprises a translinear loop formed by at least one pair of complementary transistors.

3. The operational amplifier of claim 2, wherein the complementary transistors of the translinear loop are biased using two or more pairs of transistors arranged in series.

4. The operational amplifier of claim 3, wherein the bias currents generated by the biasing circuit cause coordinated push-pull crossover transitions between the boosting transistors.

5. The operational amplifier of claim 1, further comprising:
   a resistor in series with the audio output signal generated by the output stage.

6. The operational amplifier of claim 5, wherein the series resistor buffers the input stage from the first speaker system.

7. An integrated circuit operational amplifier comprising:
   an input stage operable to receive differential input voltage signals and further operable to generate an amplified voltage signal that amplifies the difference between the input voltage signals; and
   an output stage operable to receive the amplified voltage signal and further operable to generate an audio output signal that modifies the amplified signal for playback by a first speaker system, the output stage comprising:
      a diamond driver circuit operable to buffer the input stage from the first speaker system;
      a boosting circuit operable to amplify the current of the amplified voltage signal, wherein the boost circuit comprises at least one complementary pair of boosting transistors, wherein the boosting circuit further comprises a pair of Miller compensation capacitors; and
      a biasing circuit operable to provide bias currents to the transistors of the boost circuit.

8. The operational amplifier of claim 7, wherein the boosting circuit further comprises a resistor in series with each Miller compensation capacitor.

9. An integrated circuit operational amplifier comprising:
   an input stage operable to receive differential input voltage signals and further operable to generate an amplified voltage signal that amplifies the difference between the input voltage signals; and
   an output stage operable to receive the amplified voltage signal and further operable to generate an audio output signal that modifies the amplified signal for playback by a first speaker system, the output stage comprising:
      a diamond driver circuit operable to buffer the input stage from the first speaker system;
      a boosting circuit operable to amplify the current of the amplified voltage signal, wherein the boost circuit comprises at least one complementary pair of boosting transistors;
      a biasing circuit operable to provide bias currents to the transistors of the boost circuit, wherein the diamond driver circuit includes a pair of series current sources that provide a biasing current to the biasing circuit.

10. A method for amplifying an audio signal for playback by a speaker system, the method comprising:
    receiving, at an input stage, differential input voltage signals;
    generating, at the input stage, an amplified voltage signal that amplifies the difference between the input voltage signals;
    receiving, at an output stage, the amplified voltage signal;
    buffering the input stage from the first speaker system via a diamond driver circuit of the output stage;
    amplifying the current of the amplified voltage signal via a boost circuit of the output stage, wherein the boost circuit comprises at least one complementary pair of boosting transistors, wherein the at least one complementary pair of boosting transistors are configured to provide push-pull current amplification;
    providing bias currents to the transistors of the boost circuit via a biasing circuit; and
    generating an audio output signal that modifies the amplified signal for playback by the speaker system.

11. The method of claim 10, wherein transistors of the biasing circuit and the boost circuit comprises a translinear loop formed by at least one complementary pair of transistors.

12. The method of claim 11, wherein the transistors of the translinear loop are biased using two or more pairs of transistors arranged in series.

13. The method of claim 12, wherein the bias currents generated by the biasing circuit cause coordinated push-pull crossover transitions between the boosting transistors.

14. The method of claim 11, wherein the least one complementary pair of biasing transistors are configured to alternate in providing high and low biasing currents to each of the boosting transistors.

15. The method of claim 10, further comprising:
buffering the input stage via a resistor in series with the audio output signal generated by the output stage.

16. A method for amplifying an audio signal for playback by a speaker system, the method comprising:
receiving, at an input stage, differential input voltage signals;
generating, at the input stage, an amplified voltage signal that amplifies the difference between the input voltage signals;
receiving, at an output stage, the amplified voltage signal;
buffering the input stage from the first speaker system via a diamond driver circuit of the output stage;
amplifying the current of the amplified voltage signal via a boosting circuit of the output stage, wherein the boosting circuit comprises at least one complementary pair of boosting transistors, wherein the boosting circuit further comprises a pair of Miller compensation capacitors;
providing bias currents to the transistors of the boost circuit via a biasing circuit; and
generating an audio output signal that modifies the amplified signal for playback by the speaker system.

17. The method of claim 16, wherein the boost circuit further comprises a resistor in series with each Miller compensation capacitor.

18. A method for amplifying an audio signal for playback by a speaker system, the method comprising:
receiving, at an input stage, differential input voltage signals;
generating, at the input stage, an amplified voltage signal that amplifies the difference between the input voltage signals;
receiving, at an output stage, the amplified voltage signal;
buffering the input stage from the first speaker system via a diamond driver circuit of the output stage;
amplifying the current of the amplified voltage signal via a boosting circuit of the output stage, wherein the boosting circuit comprises at least one complementary pair of boosting transistors,
providing bias currents to the transistors of the boost circuit via a biasing circuit; and
generating an audio output signal that modifies the amplified signal for playback by the speaker system, wherein the diamond driver circuit includes a pair of series current sources that provide a biasing current to the biasing circuit.

* * * * *